United States Patent [19]

Wittry

[11] 4,199,383

[45] Apr. 22, 1980

[54] METHOD OF MAKING A PHOTOVOLTAIC CELL EMPLOYING A PBO-SNO HETEROJUNCTION

[75] Inventor: David B. Wittry, Pasadena, Calif.

[73] Assignee: University of Southern California, Los Angeles, Calif.

[21] Appl. No.: 881,936

[22] Filed: Feb. 28, 1978

Related U.S. Application Data

[62] Division of Ser. No. 792,171, Apr. 29, 1977, Pat. No. 4,099,199.

[51] Int. Cl.$^2$ ............................................. H01L 27/14
[52] U.S. Cl. .................................. 148/174; 204/192 S; 427/74; 427/75; 427/108; 427/255.3; 427/255.7
[58] Field of Search .............. 427/74, 75, 108, 248 C, 427/248 J; 148/174; 204/192 S; 357/30, 16, 58, 61

[56] References Cited

U.S. PATENT DOCUMENTS

| | | | |
|---|---|---|---|
| 3,500,099 | 3/1970 | Taylor | 427/74 |
| 3,673,063 | 6/1972 | Wakefield | 148/133 |
| 3,716,424 | 2/1973 | Schoolar | 148/175 |
| 3,911,469 | 10/1975 | Wrobel | 357/30 |

OTHER PUBLICATIONS

Honig, "Vapor Pressure Data for the Solid and Liquid Elements", RCA Review, Dec. 1962, pp. 567–586.
Van den Broek et al., "Physical Properties of Lead–Tin Monoxide, A New Photoconductive Layer Material", Proc. 3rd Int. Photocond. Conf. 1969.
de Haan et al., "The Plumbicon, A New Television Camera Tube", Philips Technical Review, vol. 25, pp. 133–151, 1964.
Broerse, "Electron Bombardment Induced Conductivity in Lead Monoxide", pp. 305–314, ©1965.

*Primary Examiner*—John D. Smith
*Attorney, Agent, or Firm*—Nilsson, Robbins, Dalgarn, Berliner, Carson & Wurst

[57] ABSTRACT

A photovoltaic cell that incorporates a PbO-SnO heterojunction of graded composition which, among other applications, can be utilized for the conversion of solar energy to electrical energy. A p-i-n junction is formed while PbO and SnO are simultaneously deposited on a substrate in a varying ratio that is either decreased or increased to form the compositions $Pb_{1-x}Sn_xO$ where x varies in the range of 0 to 1.

16 Claims, 3 Drawing Figures

METHOD OF MAKING A PHOTOVOLTAIC CELL EMPLOYING A PBO-SNO HETEROJUNCTION

This is a division of application Ser. No. 792,171, filed Apr. 29, 1977, now U.S. Pat No. 4,099,199.

BACKGROUND OF THE INVENTION

The usual photovoltaic cell is fabricated of silicon, germanium, gallium arsenide or other such semiconductor material in which a p-n junction is formed and through which light is projected to cause electron carriers to cross the p-n junction. Electrons in such materials are usually not free to move from atom to atom within the crystal, but light striking such crystals provides the energy needed to free some electrons from their bound condition. Free electrons cross the p-n junction more easily in one direction than in the other giving one side of the junction a negative charge and, therefore, a negative voltage with respect to the other side. The efficiencies of such crystals range from 7 to 14 percent with a maximum theoretical efficiency in the range of 20 percent.

A major cause of the low efficiencies of photovoltaic cells is so-called junction loss which results from the flow of carriers (electrons or holes) back across the junction. Back flow can be minimized by increasing the band gap of the junction and efficiency can thereby be increased for selected wavelength ranges, but efficiency in converting solar energy will still be low because only a limited portion of the solar energy spectrum can be utilized. Photovoltaic cells employing graded band gaps have been proposed to better utilize the solar energy spectrum. Also, cells with graded impurity levels have been proposed to produce an internal field in the bulk material to reduce junction loss. Nevertheless, no structure has been developed with the specific materials required to successfully implement such concepts.

A second problem in utilizing many inexpensive semiconductor materials for solar energy conversion is the difficulty of obtaining high carrier collection efficiencies. This results because it is often difficult to manufacture these materials with sufficient quality to obtain long carrier lifetimes or high carrier mobilities.

SUMMARY OF THE INVENTION

The present invention provides a photovoltaic cell fabricated with photoconductive material which utilizes varying proportions of PbO and SnO to overcome the foregoing problems of junction loss and of low carrier collection efficiency. The photoconductive material comprises $Pb_{1-x}Sn_xO$ formed with a p-i-n heterojunction, in which x varies in the range of 0 to 1. The junction is graded so as to vary either from PbO to SnO, from SnO to PbO, or from one intermediate composition to another intermediate composition. The energy band gaps of such materials vary from 1.94 eV for pure PbO to 0.62 for pure SnO. The photovoltaic cell is constructed so that incident light falls on the PbO rich side of the structure. Accordingly, photons of highest energy are absorbed first while photons with energy less than the band gap at the surface penetrate to a depth such that the band gap is suitable for strong absorption. As a result, a much higher proportion of the photons in the solar spectrum can be utilized.

In a specific embodiment, the thickness of the intrinsic region is large relative to the thickness of each of the n and p type regions. The junction is obtained by simultaneously depositing PbO and SnO on a substrate heated to a temperature which is below the tetragonal-orthorhombic transformation temperature of PbO. Quantities of PbO and SnO are deposited in a varying ratio that either decreases or increases to form the composition $Pb_{1-x}Sn_xO$ where x varies in the range of 0 to 1; preferably, in the intrinsic region, x is in a range from a value greater than 0 to a value less than 1. The composition can be varied uniformly. Alternatively, the bulk of the intrinsic region can be of a specific composition optimized for a particular spectrum. Depending on the dopant and/or process conditions utilized in manufacture, either a p-i-n or n-i-p junction can be obtained.

An additional advantage obtained by use of the photocell of this invention is that a relatively broad electric field is present across the heterojunction, which forces electrons to the n side and holes to the p side. Accordingly, the average distance (1) that the carriers can travel in the bulk material before recombining is determined by:

$$L = \mu E \tau$$

where $\mu$ is the mobility, E is the electric field and $\tau$ is the lifetime of the carriers. In contrast, the junction width in a standard solar cell is very small and consequently the excess carriers must arrive at the junction by diffusion. Therefore, the average distance (L') that the carriers can travel before recombining is determined by the diffusion length which is:

$$L' = \sqrt{\mu k T \tau / e}$$

where kT/e is the thermal energy at temperature T. It will be appreciated that thermal energy is a considerably smaller influencing factor than the electric field present in the photovoltaic cell of the present invention.

A further advantage is obtained with respect to carrier collection efficiency in that with the heterojunction cell it is not necessary that the excess carriers arrive at the contacts to produce power. When the cell is producing an output voltage, the carriers move in such a direction that they produce an internal current opposite to the gradient of the Fermi energy. Thus, in contrast to conventional thin film cells, the dimensions are not critical and the cell thickness can be chosen to better optimize the absorption of solar energy.

CITATION OF PRIOR ART

Prior art with respect to the present invention is enclosed herewith and includes:

(1) E. F. De Haan, A. Van Der Grift, and P. M. Schampers, Philips Tech. Rev. 25, 1963/64 No. 6/7 pp. 133–151.

(2) J. Van den Broek, W. Kwestroo, C. Langereis and A. Netten, Proc. 3rd International Photoconductivity Conference, Stanford, 1969; (Pergamon Press, New York, 1971).

(3) P. H. Broerse, in *Advances in Electronics and Electron Physics*, Vol. 22a, L, Marton ed. (Academic Press, New York, 1965) pp. 305–314.

(4) U.S. Pat. No. 3,500,099 to Taylor.

(5) U.S. Pat. No. 3,673,063 to Wakefield.

(6) U.S. Pat. No. 3,716,424 to Schoolar.

(7) U.S. Pat. No. 3,911,469 to Wrobel.

(8) "Vapor Pressure Data for the Solid and Liquid Element," *RCA Review*, XXIII, No. 4 (1962), pp. 567–586.

The E. F. De Haan et al article describes the use of PbO in a vidicon-type tube. The J. Van den Broek et al article demonstrates that the tetragonal form of SnO is isomorphic with PbO, and that the energy band gap varies in a continuous manner from 1.94 eV for pure PbO to 0.62 for pure SnO. The P. H. Broerse article estimates the mobility of electrons in a layer of PbO at about 100 cm$^2$/volt sec. Taylor U.S. Pat. No. 3,500,099 describes the use of a PbO photoconductive member for use in a vidicon-type tube. A thin layer of PbO vapor deposited on a signal plate formed of SnO$_2$ on glass, and a second, thicker layer of PbO is vapor deposited on the first PbO layer, with the ambient controlled so that the first thin layer of PbO is n-type, whereas the thicker layer is intrinsic. Wakefield's U.S. Pat. No. 3,673,063, Schoolar U.S. Pat. No. 3,716,424 and Wrobel U.S. Pat. No. 3,911,469 are each directed to junction diodes and photovoltaic infrared detectors utilizing lead sulfide or mixtures of lead telluride and tin telluride. The *RCA Review* article provides data on vapor pressure vs. temperature for various materials and source of substrate temperatures, and is pertinent to methods of preparing the present invention.

DETAILED DESCRIPTION

Preliminarily, it is pointed out that the present construction differs from a standard photoelectric cell in the composition of the material constituting the junction, including concepts pertinent thereto as will be referred to hereinafter, and in certain thickness considerations achievable with the present invention but not ordinarily practiced with the usual photovoltaic cell. In other regards, the photovoltaic cell has electrical and physical structure known to the art. Additionally, the methods for preparation of the compositions and for construction of the photovoltaic cells employ techniques generally known to the semiconductor and photovoltaic cell art, respectively, novelty residing primarily in the application of specific materials in specific orders and gradations to achieve the desired result. Accordingly, details will be given mainly with respect to the novel aspects of the invention.

Figure 1:
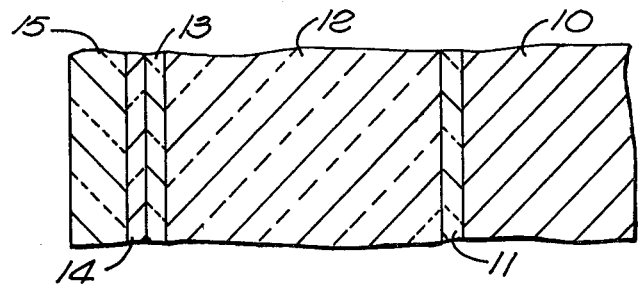
FIG. 1 is a cross-sectional, schematic view of a photovoltaic cell employing a p-i-n PbO-SnO heterojunction.

Elements of a photovoltaic cell of the present invention are shown in FIG. 1. The cell includes a conducting back 10 on which is deposited n, i and p regions 11, 12 and 13, respectively, followed by a conducting layer 14 which is transparent to visible or infrared light and a corresponding similar transparent encapsulating layer 15. The conducting back 10 consists of any suitable substrate metal such as tin or tin plated iron. In a particular embodiment, the n-type region 11 is deposited directly on the conducting back 10 as a thin layer of material selected from SnO and Pb$_{1-x}$Sn$_x$O, appropriately doped or fabricated to be of n-type conductivity. The intrinsic region 12 is deposited directly on the thin n-type region 11 and consists of Pb$_{1-x}$Sn$_x$O. The p-type, barrier region 13 is selected from PbO and Pb$_{1-x}$Sn$_x$O.

The value of x is progressively smaller from the n-type region 11 to the p-type region 13 from a value of less than 1 to a value equal to or greater than 0. Preferably, the value of x adjacent the conducting back 10 is greater than 0.3. The transparent conducting layer 14 consists of SnO$_2$ or any other suitable transparent conducting material, as known. The transparent encapsulating material 15 can be glass of any usual composition as known and completes the photovoltaic cell assembly.

Although the photovoltaic cell illustrated in FIG. 1 has been described as a p-i-n device in which the outer region 13 is of p-type material, it will be appreciated that both electrons and holes are capable of carrying current in PbO. Accordingly, cells can be constructed in which the outer PbO region 13 is of n-type material and the inner region 11 is of p-type material. In both cases, the incident light would fall on the PbO rich side of the structure so that photons of highest energy would be absorbed first, while photons with energy less than the band gap at the surface would penetrate to such a depth that the band gap is suitable for strong absorption.

With regard to solar energy conversion, one could fabricate the intrinsic region so as to have an energy band gap optimized for the solar spectrum by choosing a composition in which x has a fixed value in the range of 0.3 to 0.4. In a specific example, the intrinsic region can contain about 33% (⅓ molecular fraction) SnO, the balance being essentially PbO (i.e., Pb$_{1-x}$Sn$_x$O in which x is 0.33). Such a structure would not provide as high an efficiency of conversion as would a structure having a graded intrinsic region, but savings in cost of fabrication can be obtained by avoiding the temperature and other process control variations required for a graded structure.

It will be appreciated that one can use either pure PbO or a mixture of PbO-SnO as the outer thin region 13 and that one can use a mixture of PbO and SnO, or pure SnO, for the inner thin region 11. The word "pure" will be understood to refer to the identity of the oxide material and not to the absence of materials which are referred to in the art as "impurities" that affect the electronic properties of the carrier oxide material. In fact, such impurities are usefully provided to define the electronic nature of the material as n, i or p-type. For example, the deposit may be doped with thallium, copper or silver to provide p-type material, or with bismuth, antimony or arsenic to obtain n-type material. A simple alternative or adjunctive procedure for variation of the conductivity type is to control the oxygen concentration during deposition. By using a concentration of oxygen which is greater than stoichiometric during evaporation, as the procedure which will be described hereinafter, either by increasing the pressure of oxygen during evaporation or by reducing the evaporation rate, material having p-type conductivity can be obtained. Alternatively, by decreasing the oxygen concentration, material having n-type conductivity can be obtained. Of course, combinational steps can be used.

Thus, in exemplary embodiments, the photoconductive material can be fabricated to have n-i-p regions 11, 12 and 13 comprising successive layers of: (I) SnO, Pb$_{1-x}$Sn$_x$O and PbO in which x decreases in graded manner from a value close to unity to a value equal to or nearly equal to one; (II) Pb$_{1-x'}$Sn$_{x'}$O and PbO in which x' has a specific value, say 0.33; and (III) Pb$_{1-x}$Sn$_x$O, Pb$_{1-x'}$Sn$_{x'}$O and Pb$_{1-x''}$Sn$_{x''}$O in which x, x' and x" have successively lower values in the range of 0 to 1. In further specific embodiments, the photoconductive material of each of examples I-III can be fabricated with the n-i-p order reversed.

As brought out above in the Summary of the Invention, an advantage obtained by use of the structure of FIG. 1, relates to the provision of a relatively thick intrinsic region, which gives rise to a broad electric field across the heterojunction. As a result, the major influencing factor is the electric field determined by the geometry of the system, rather than by ambient temperature. In this regard, the p and n type regions should have a relatively small thickness compared to the intrinsic region. As an example, the p and n regions can be about 1 micron thick, while the intrinsic region can have a thickness of, say, 15 microns. A preferred range would be about 0.5 microns to 2 microns for the p and n type regions and about 5 microns to 20 microns for the intrinsic region.

Figure 2:
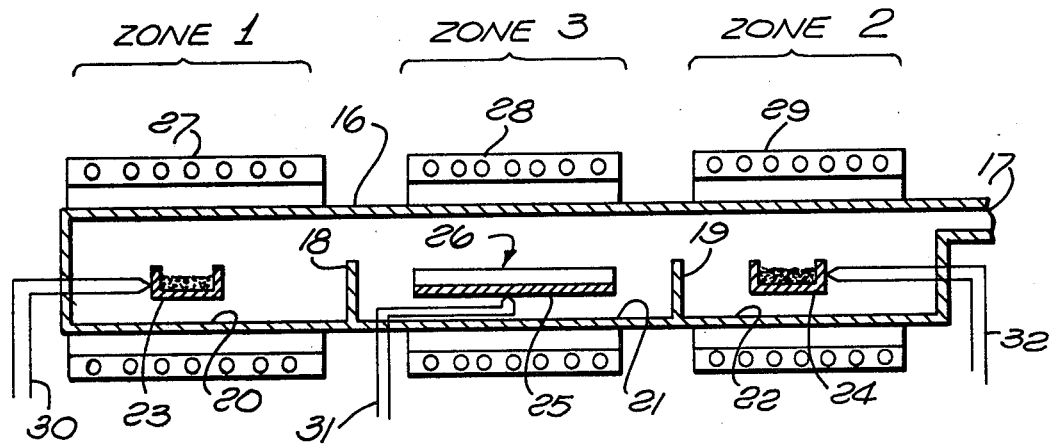
FIG. 2 is a cross-sectional, schematic view of a three-zone furnace utilizing the vapor transport method to fabricate the PbO-SnO heterojunction.

The photovoltaic cells of the present invention can be manufactured by any of several known procedures, one of which is a three zone furnace and vapor transport method as illustrated in FIG. 2, whereby PbO and SnO can be simultaneously evaporated for deposition onto a substrate. The apparatus includes a closed, vacuum-tight chamber 16 with an opening 17 to which an oxygen source (not shown) is attached. The chamber 16 is divided by partial partitions 18 and 19 into three furnaces 20, 21 and 22. The oxygen source contains a control means such that the pressure of the oxygen in the furnace can be maintained at the levels outlined below. The source material for the PbO and SnO can be either lead or tin, respectively, or PbO or SnO, respectively, and the source material may be appropriately doped as previously indicated to aid in providing the appropriate electronic properties, as is known. In a particular example, the furnace 20 on one end of the chamber 16 includes a crucible 23 containing a quantity of lead doped with about 10 parts per million of thallium. The furnace 22 on the other end of the chamber 16 includes a crucible 24 containing, in this example, tin appropriately dope with about 10 parts per million of bismuth, antimony or arsenic. A substrate 25 such as a sheet of tin or tin-plated iron, is supported (by means not shown) in the furnace 21 in between the end furnaces 20 and 22 and receives the growing layer 26. The furnaces 20, 21 and 22 may be any known type and can be heated as indicated by heaters 27, 28 and 29, or by means of induction heating, by electron bombardment, or by heating coils with appropriate configurations, all as known. Thermocouples 30, 31 and 32 are included, associated with the furnaces 20, 21 and 22, respectively, so as to enable determination of the temperature of each component.

The temperature of the substrate should be above the decomposition temperature of $PbO_2$ (290° C.) and also above the decomposition temperature of $Pb_2O_3$ (390° C.) for ease in maintaining the desired composition of the deposit. However, some control of composition can also be provided by varying the evaporation rate and/or pressure of oxygen during evaporation. The temperature of the substrate should not exceed the temperature at which the transition from the tetragonal to the orthorhombic form of PbO occurs (489°-587° C.) when nearly pure PbO is formed but should also not exceed the temperature at which SnO decomposes to $Sn + Sn_3O_4$ (about 400° C.) if pure SnO is being formed. Accordingly, in the present example, when depositing material rich in SnO on the conductive substrate 10, a fairly narrow temperature range of 390°-400° C. should be maintained, at least until growth of the PbO layer.

Evaporation takes place in a gaseous atmosphere of pure oxygen at a pressure of between a few millitorr and a few torr. During evaporation, the temperature of the materials are controlled so that they are varied in a graded manner. Preferably, the process is controlled so as to vary the composition linearly with deposit thickness. However, as previously indicated, one could fabricate the intrinsic region with a specific composition optimized for any particular spectrum.

After deposition of the outer PbO region, the transparent conductive layer 14 of $SnO_2$ can be applied using any known technique, and an impervious transparent plastic material, such as epoxy resin, or glass sealed with epoxy resin can be used to encapsulate the cell structure so as to provide isolation from water vapor and air.

In conducting the foregoing process, the source materials are heated at temperatures sufficient for evaporation at the desired rates. In this regard, reference can be made to "Vapor Pressure Data for the Solid and Liquid Elements," *RCA Review*, XXIII, No. 4 (1962), pp. 567-586 (copy enclosed), incorporated herein by reference. For example, the end furnaces 27 and 29 can be heated at initial temperatures of 800° C. and 1400° C., respectively, under an oxygen pressure of 0.001 torr for a time sufficient to deposit on the substrate, maintained at 395° C., a layer of about 1 micron thick of $Pb_{1-x}Sn_xO$ where x is 0.9. Following deposition of the n layer so formed, the temperature of the other end furnace 29 can be decreased so as to increase the relative extent of deposition of PbO vs. SnO. For example, starting with the initial temperature of 1400°, the temperature of the end furnace 29 can be decreased in a uniform manner while the temperature of the first end furnace 27 is increased, until there is formed on the substrate 25 an intrinsic layer about 5 to 15 microns thick having the composition $Pb_{1-x}Sn_xO$ in which x varies from 0.9 to 0. Thereafter, the temperature of the first end furnace 27 can be maintained at 900° C. for a specified time so that a final layer of relatively pure PbO, about 1 micron thick, is deposited on the intrinsic layer. During deposition of the final layer, the oxygen pressure may be increased to about 0.1 torr to convert the PbO into a p-type material.

It will be appreciated that different sequences of fabrication can be utilized. Thus, one can start with glass as the substrate and apply the material so as to grow from PbO to $Pb_{1-x}Sn_xO$. In this case, an impervious plastic such as epoxy resin can be applied to the back side after fabrication to provide isolation from the external environment. Also in this case, during the formation of the $PbO_{1-x}Sn_x$ layer it would be desirable to vary the temperature of the substrate during deposition from about 500° C., the deposition temperature of $Pb_3O_4$ (but below the orthorhombic transition temperature) to below 400° C., the decomposition temperature of SnO.

Figure 3:
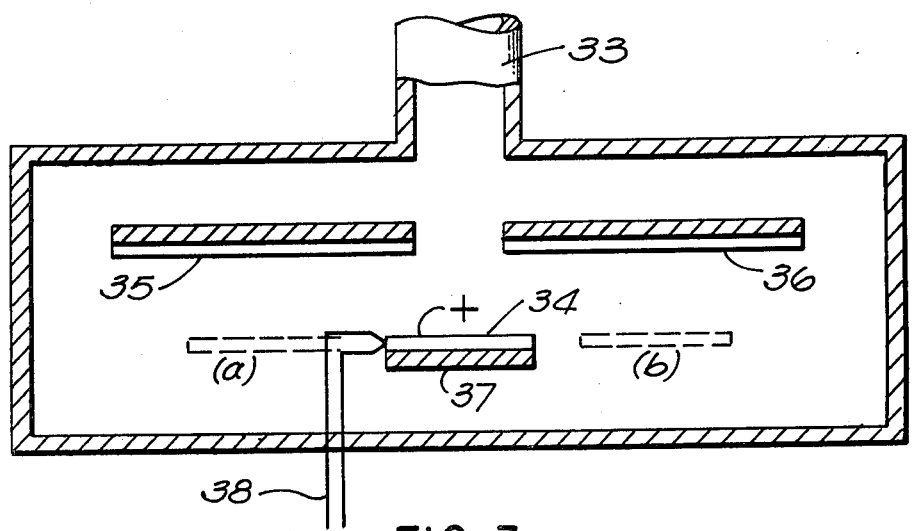
FIG. 3 is a cross-sectional, schematic view of sputtering apparatus for fabricating the PbO-SnO heterojunction.

Referring to FIG. 3, a method of fabrication by means of reactive gas sputtering is illustrated. The process conditions are similar to those used with respect to vacuum evaporation as described with respect to FIG. 2 in that substrate temperatures and doping considerations are quite similar. An oxidizing atmosphere is obtained by use of oxygen pressure of about 100 millitorr introduced through a tube 33. In this case, as is usual in sputtering, the substrate 34 is biased positively and the sources 35 and 36 are each biased negatively so that there is a potential of between 1,000 and 5,000 volts between the substrate and each of the sources. The temperature of the substrate is controlled by a heater 37 and a thermocouple 38, so as to provide control over crystal perfection, growth of larger crystallites and control of the phase deposited. One can use pure lead or doped lead, as appropriate to the conductivity type desired, as one source 35 and pure tin or doped tin as the other source 36. Sputtering is conducted using known techniques, but also using a moxing target geometry in which the substrate 34 is moved from a position indicated at (a) adjacent one source 35 to a position indicated by (b) adjacent the other source 36 so as to allow for continuous variation in the composition. In one method of preparation, the substrate can be formed of transparent material such as glass coated with a transparent conducting layer of $SnO_2$. In this case, the process would start with the substrate located at position (a) adjacent the source of lead. In another embodiment, the substrate can be metal such as tin or tin plated iron, in which case the process would start with the substrate located initially at the position (b) adjacent the source 36 of tin and then moved to the position (a) adjacent the source 35 of lead.

As required, illustrative embodiments of the invention have been disclosed. However, it is to be understood that these embodiments merely exemplify the invention, which may take forms different from the specific embodiments. Therefore, specific structural and functional details are not necessarily to be interpreted as limiting, but as a basis for the claims.

What is claimed is:

1. In a method of making a photovoltaic cell, the steps comprising:
    providing a substrate of electrically conductive material;
    forming on said substrate a first region of photoconductive material selected from SnO and $Pb_{1-x}Sn_xO$, having a first conductivity type;
    forming a second region, of intrinsic photoconductive $Pb_{1-x}Sn_xO$, on said first region; and
    forming a third region, of photoconductive material selected from PbO and $Pb_{1-x}Sn_xO$ having a conductivity type opposite said first conductivity type, on said second region;
    wherein x is progressively smaller from said first region to said third region from a value of less than 1 to a value of greater than 0.

2. The method of claim 1 in which x in said intrinsic region varies in graded manner across the thickness of said intrinsic region.

3. The method of claim 1 in which at least said intrinsic region is formed by simultaneous deposition of PbO and SnO.

4. The method of claim 3 in which the relative amounts of said deposited PbO and SnO are varied during formation of at least said intrinsic region.

5. The method of claim 1 wherein said substrate temperature is maintained at about 390° C.–400° C. during formation of said region of photoconductive material.

6. The method of claim 1 wherein said photoconductive material is formed by controlled vacuum evaporation of PbO and SnO.

7. The method of claim 1 wherein said photoconductive material is formed by reactive gas sputtering from separate sources of Pb and Sn in an oxidative atmosphere.

8. The method of claim 7 wherein said substrate is moved from a position adjacent said Sn source to a position adjacent to said Pb source during formation of said photoconductive material to obtain a gradation in the concentration of Sn and Pb.

9. In a method of making a photovoltaic cell, the steps comprising:
    providing a substrate of electrically conductive material;
    forming on said substrate a first region of photoconductive material selected from PbO and $Pb_{1-x}Sn_xO$ having a first conductivity type;
    forming a second region, of intrinsic photoconductive $Pb_{1-x}Sn_xO$, on said first region; and
    forming a third region of photoconductive material selected from SnO and $Pb_{1-x}Sn_xO$, having a conductivity type opposite said first conductivity type, on said second region;
    wherein x is progressively larger from said first region to said third region from a value of greater than 0 to a value of less than 1.

10. The method of claim 9 in which x in said intrinsic region varies in graded manner across the thickness of said intrinsic region.

11. The method of claim 9 in which at least said intrinsic region is formed by simultaneously deposition of PbO and SnO.

12. The method of claim 11 in which the relative amounts of said deposited PbO and SnO are varied during formation of at least said intrinsic region.

13. The method of claim 9 wherein said substrate temperature is varied from an initial temperature of about 500° C., but below the orthorhombic transition temperature of PbO, to below 400° C.

14. The method of claim 9 wherein said photoconductive material is formed by controlled vacuum evaporation of PbO and SnO.

15. The method of claim 9 wherein said photoconductive material is formed by reactive gas sputtering from separate sources of Pb and Sn in an oxidizing atmosphere.

16. The method of claim 15 wherein said substrate is moved from a position adjacent said Pb source to a position adjacent said Sn source during formation of said photoconductive material to obtain a gradation in the concentration of Sn and Pb.

* * * * *